(12) United States Patent
Chandrasekaran et al.

(10) Patent No.: US 11,104,571 B2
(45) Date of Patent: Aug. 31, 2021

(54) MICROPHONE WITH INTEGRATED GAS SENSOR

(71) Applicant: Knowles Electronics, LLC, Itasca, IL (US)

(72) Inventors: Venkataraman Chandrasekaran, Itasca, IL (US); John Szczech, Schaumburg, IL (US); Joshua Watson, Itasca, IL (US); Claus Furst, Roskilde (DK)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/312,324

(22) PCT Filed: Jun. 9, 2017

(86) PCT No.: PCT/US2017/036771
§ 371 (c)(1),
(2) Date: Dec. 21, 2018

(87) PCT Pub. No.: WO2017/222832
PCT Pub. Date: Dec. 28, 2017

(65) Prior Publication Data
US 2019/0194013 A1 Jun. 27, 2019

Related U.S. Application Data

(60) Provisional application No. 62/354,377, filed on Jun. 24, 2016.

(51) Int. Cl.
*B81B 7/00* (2006.01)
*H04R 1/04* (2006.01)
*H04R 19/04* (2006.01)

(52) U.S. Cl.
CPC ............. *B81B 7/0061* (2013.01); *H04R 1/04* (2013.01); *H04R 19/04* (2013.01);
(Continued)

(58) Field of Classification Search
CPC ........ H04R 31/006; H04R 1/04; H04R 3/005; H04R 2201/003; H04R 19/04;
(Continued)

(56) References Cited

U.S. PATENT DOCUMENTS 6,987,459 B2   1/2006   Tice
7,190,038 B2   3/2007   Dehe et al.
(Continued)

OTHER PUBLICATIONS

International Search Report and Written Opinion, PCT/US2017/036771 (dated Aug. 28, 2017).
ISR dated Aug. 28, 2017.

*Primary Examiner* — William A Jerez Lora
(74) *Attorney, Agent, or Firm* — Foley & Lardner LLP (57) ABSTRACT

Systems and apparatuses for a microelectromechanical system (MEMS) device. The MEMS device includes a housing, a transducer, and a sensor. The housing includes a substrate defining a port and a cover. The substrate and the cover cooperatively form an internal cavity. The port fluidly couples the internal cavity to an external environment. The transducer is disposed within the internal cavity and positioned to receive acoustic energy through the port. The transducer is configured to convert the acoustic energy into an electrical signal. The sensor is disposed within the internal cavity and positioned to receive a gas through the port. The sensor is configured to facilitate detecting at least one of an offensive odor, smoke, a volatile organic compound, carbon monoxide, carbon dioxide, a nitrogen oxide, methane, and ozone.

19 Claims, 5 Drawing Sheets

(52) U.S. Cl.
CPC ............ *B81B 2201/0214* (2013.01); *B81B 2201/0257* (2013.01); *B81B 2201/0278* (2013.01); *B81B 2207/012* (2013.01); *H04R 2201/003* (2013.01)

(58) Field of Classification Search
CPC .......... H04R 19/005; H04R 2499/13; B81B 7/0061; B81B 2201/0214; B81B 2201/0257; B81B 2201/0278; B81B 2207/012; H04S 7/00; H04S 2420/01
USPC ......... 381/71.2, 91, 94.7, 95, 113, 122, 175, 381/302, 355, 375
See application file for complete search history.

(56) References Cited

U.S. PATENT DOCUMENTS

| | | | |
|---|---|---|---|
| 7,473,572 B2 | 1/2009 | Dehe et al. | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 8,705,777 B2* | 4/2014 | Je | H04R 31/00 381/175 |
| 2002/0021816 A1 | 2/2002 | Collins | |
| 2005/0207605 A1 | 9/2005 | Dehe et al. | |
| 2006/0210106 A1* | 9/2006 | Pedersen | B81B 3/0072 381/355 |
| 2007/0278501 A1 | 12/2007 | MacPherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0097687 A1* | 4/2009 | Collins | H04R 31/003 381/369 |
| 2009/0175477 A1 | 7/2009 | Suzuki et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2013/0174646 A1* | 7/2013 | Martin | G01N 33/0075 73/31.02 |
| 2014/0044297 A1* | 2/2014 | Loeppert | H04R 1/08 381/355 |
| 2015/0003638 A1* | 1/2015 | Kasai | H04R 1/08 381/122 |
| 2015/0032198 A1 | 1/2015 | Folk | |
| 2015/0102437 A1 | 4/2015 | Liu et al. | |
| 2015/0226585 A1* | 8/2015 | Yang | G01D 11/245 73/431 |
| 2015/0321908 A1 | 11/2015 | Wagner et al. | |
| 2015/0382120 A1 | 12/2015 | Baskaran et al. | |

\* cited by examiner

MICROPHONE WITH INTEGRATED GAS SENSOR

CROSS-REFERENCE TO RELATED PATENT APPLICATIONS

This application is a National Stage Application of PCT/US2017/036771, filed Jun. 9, 2017, which claims the benefit of and priority to U.S. Provisional Patent Application No. 62/354,377, filed Jun. 24, 2016, which is incorporated herein by reference in its entirety.

BACKGROUND

The following description is provided to assist the understanding of the reader. None of the information provided or references cited is admitted to be prior art.

Gas sensors may be configured to detect the presence of offensive odors, smoke, volatile organic compounds, etc. that may have a negative impact on human health, comfort, and/or productivity. Gas sensors may be used in various electronic devices, such as smartphones, portable computers, tablets, hearing aids, etc. However, when placed within the device, the internal heat generated by other components of the device may alter ambient temperature and humidity levels which may negatively impact the measurement accuracy of the gas sensor.

SUMMARY

In general, one aspect of the subject matter described in this specification can be embodied as a microelectromechanical system (MEMS) device. The MEMS device includes a housing, a transducer, and a sensor. The housing includes a substrate defining a port and a cover. The substrate and the cover cooperatively form an internal cavity. The port fluidly couples the internal cavity to an external environment. The transducer is disposed within the internal cavity and positioned to receive acoustic energy through the port. The transducer is configured to convert the acoustic energy into an electrical signal. The sensor is disposed within the internal cavity and positioned to receive a gas through the port. The sensor is configured to facilitate detecting at least one of an offensive odor, smoke, a volatile organic compound, carbon monoxide, carbon dioxide, a nitrogen oxide, methane, and ozone.

In general, another aspect of the subject matter described in this specification can be embodied in a microelectromechanical system (MEMS) device. The MEMS device includes a housing, a transducer, and a sensor. The housing includes a substrate and a lid defining a port. The substrate and the lid cooperatively form an internal cavity. The port fluidly couples the internal cavity to an external environment. The transducer is disposed within the internal cavity and positioned to receive acoustic energy through the port. The transducer is configured to convert the acoustic energy into an electrical signal. The sensor is disposed within the internal cavity and positioned to receive a gas through the port. The sensor is configured to facilitate detecting at least one of an offensive odor, smoke, a volatile organic compound, carbon monoxide, carbon dioxide, a nitrogen oxide, methane, and ozone.

In general, another aspect of the subject matter described in this specification can be embodied in a microphone device. The microphone device includes a substrate, a lid coupled to the substrate, a microphone transducer, and a gas sensor. The substrate and the lid cooperatively form an internal cavity. At least one of the substrate and the lid define a port fluidly coupling the internal cavity to an external environment. The microphone transducer is disposed within the internal cavity and positioned to receive acoustic energy through the port. The microphone transducer is configured to generate a first electrical signal based on the acoustic energy. The gas sensor is disposed within the internal cavity and positioned to receive a gas through the port. The gas sensor is configured to interact with the gas and generate a second electrical signal based on the gas.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

According to an exemplary embodiment, a MEMS device (e.g., for a smartphone, a tablet, a laptop, a smart watch, a hearing aid, a video camera, a communications device, etc.) includes a microphone and a gas sensor. The gas sensor may be configured to provide an indication of indoor and/or outdoor air quality. For example, the gas sensor may be configured to facilitate detecting the presence of offensive odors, smoke, volatile organic compounds, etc. that may have a negative impact on human health, comfort, and/or productivity. As with other environmental sensors such as humidity sensors and/or temperature sensors in MEMS devices with microphones, the gas sensor has access to an ambient environment to make accurate measurements. Co-packaging the gas sensor with the microphone inside the MEMS device may advantageously minimize the proximity of the gas sensor to the ambient environment via an acoustic port and/or an independent gas port, as well as may maximize the separation of the gas sensor from internal heat sources of an end-user device (e.g., a smartphone, a tablet, a laptop, a smart watch, a hearing aid, a video camera, a communications device, etc.) the MEMS device is coupled to (e.g., disposed within, etc.). By way of example, packaging the gas sensor inside a MEMS device with a microphone may position the gas sensor at and/or near the periphery of the end-user device, away from internal heat sources such as a main processor of the end-user device and/or fluidly couple the gas sensor better to the ambient through a port/hole of the MEMS device. Heat sources inside the end-user device (e.g., the main processor, etc.) may otherwise alter the ambient temperature and humidity levels which may impact the measurement accuracy of the gas sensor.

MEMS Device Overview

According to the exemplary embodiment shown in FIGS. 1-10, a MEMS device, shown as MEMS device 100, includes a substrate, shown as base 110; a cover, shown as lid 130, coupled (e.g., attached, secured, with adhesive, with solder, etc.) to the base 110 forming a housing of the MEMS device 100; a transducer die, shown as microphone transducer 150; a sensor die, shown as gas sensor 170; and a circuit, shown as integrated circuit 200. As shown in FIGS. 1-10, the base 110 and the lid 130 cooperatively form an internal cavity or back volume of the housing, shown as housing cavity 102. According to an exemplary embodiment, at least one of the base 110 and the lid 130 define a port that fluidly couples the housing cavity 102 to an ambient environment (e.g., an environment external to the housing of the MEMS device 100, etc.) such that sound (e.g., acoustic energy, acoustic waves, etc.), air, and/or gases may flow through the port into the housing cavity 102. Accordingly, the MEMS device 100 may be configured as at least one of a top port MEMS device and a bottom port MEMS device.

According to an exemplary embodiment, the base 110 is or includes a printed circuit board (PCB). By way of example, the PCB may include a solder mask layer, a metal layer, and an inner PCMB layer (e.g., manufactured from FR-4 material, etc.). In some embodiments, the base 110 includes alternative layers of conductive material (e.g., copper, gold, silver, aluminum, etc.) and non-conductive material (e.g., FR-4 material, etc.). The base 110 may facilitate electrically coupling components of the MEMS device 100 within the housing cavity 102 (e.g., the microphone transducer 150, the gas sensor 170, the integrated circuit 200, etc.) to other components and/or other devices outside of the housing of the MEMS device 100. As shown in FIGS. 2-10, the base 110 includes a first surface, shown as exterior surface 112, and an opposing second surface, shown as interior surface 114. By way of example, the interior surface 114 of the base 110 may include etched portions of conductive material (e.g., that define lead pads, bond pads, ground pads, etc.) that may be electrically connected to the microphone transducer 150, the gas sensor 170, and/or the integrated circuit 200 (e.g., through wire bonding, flip chip bonding, etc.). Such etched portions may be electrically coupled to conductive vias extending through the base 110. The conductive vias may include holes drilled through the base 110 and filled and/or plated with a conductive material. The conductive vias may be electrically connected to connection areas formed on the exterior surface 112 of the base 110. The connections areas may be or include customer pads configured to facilitate electrically connecting the MEMS device 100 to an external board of an end-user device (e.g., a smartphone, a laptop, a smart watch, a tablet, a hearing aid, etc.). For example, if the MEMS device 100 is deployed in a smartphone, the connection areas may be electrically coupled to a motherboard of the smartphone. It shall be understood that various fabrication approaches may be used to construct the base 110 and various electrical paths may be formed within the base 110.

According to an exemplary embodiment, the lid 130 is attached to the base 110 and forms the housing cavity 102 with the base 110. A peripheral edge of the lid 130 may be attached to the base 110 (e.g., with adhesive, solder, etc.) such that the peripheral edge of the lid 130 is hermetically sealed to the base 110, thereby forming an acoustic seal around peripheral edge. According to an exemplary embodiment, the lid 130 has a generally cup-shaped profile. In other embodiments, the lid 130 includes a peripheral wall and a flat top surface coupled to the peripheral wall. The lid 130 may be made of pre-molded metal and/or plastic. In some embodiments, the lid 130 includes multiple layers, such as one or more plastic, ceramic, and/or metal layers. The lid 130 may include an internal metal coating that is configured to provide an electromagnetic shield (e.g., a Faraday cage, etc.), thereby preventing disturbances from external electromagnetic signals.

Figure 4:
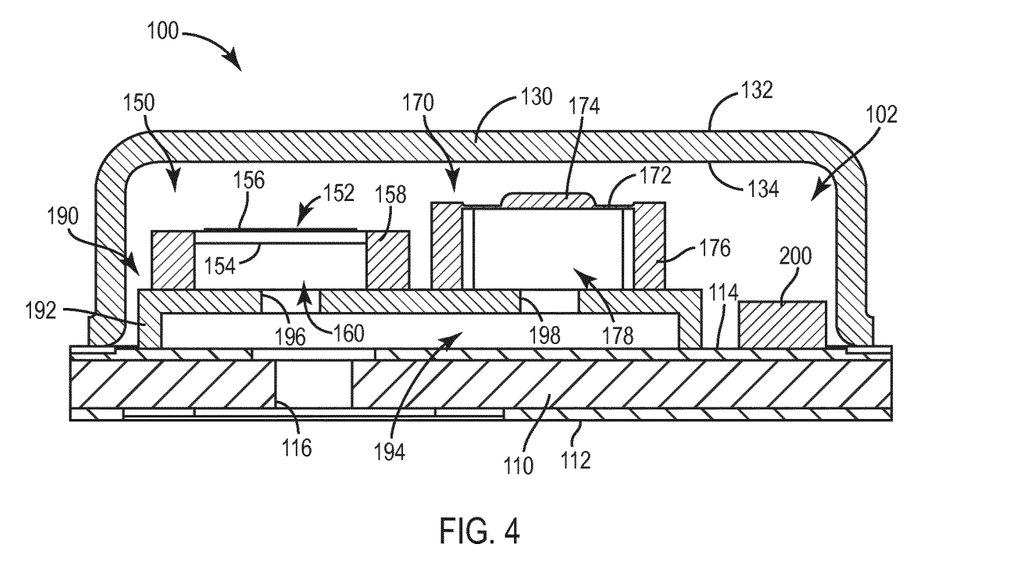
Figure 5:
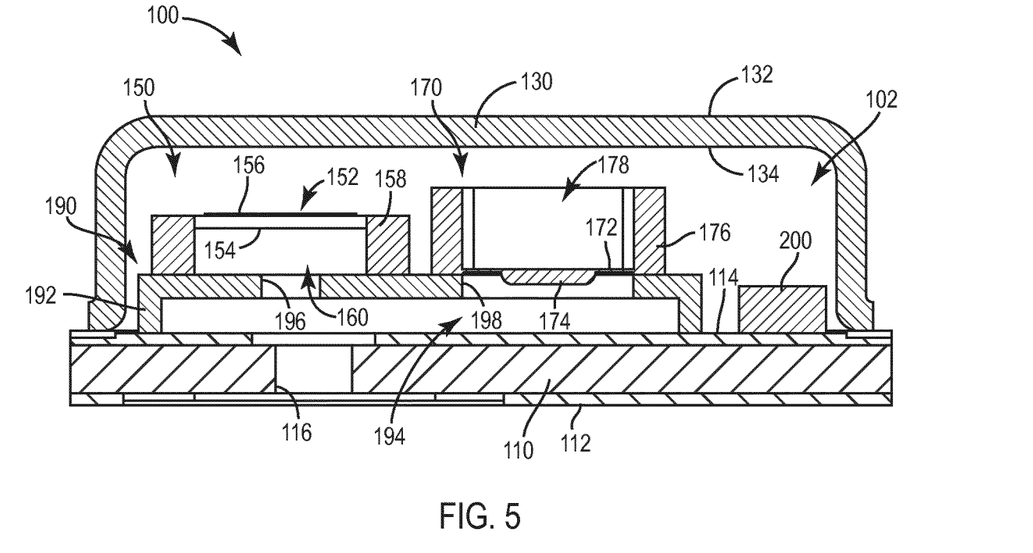
Figure 6:
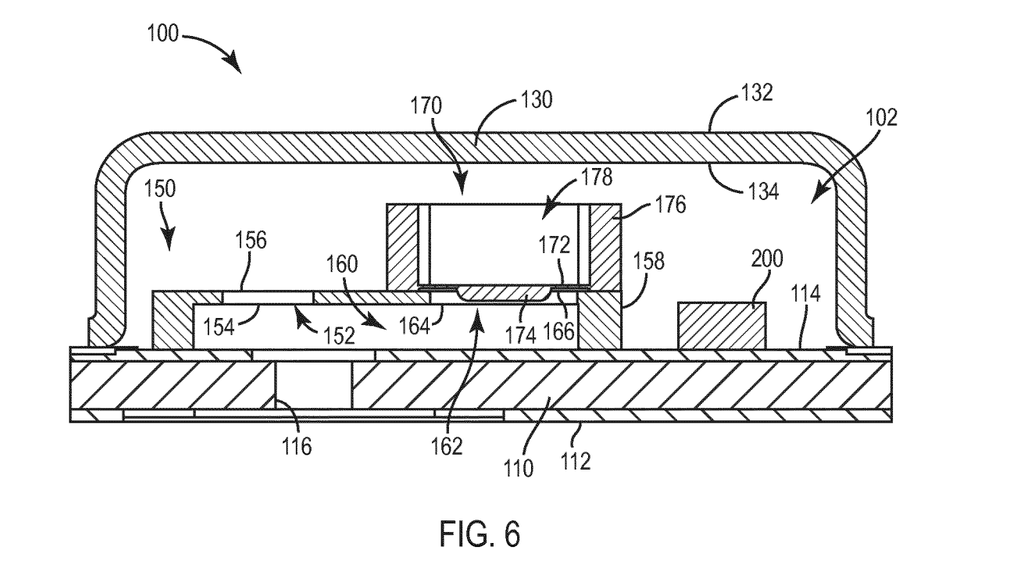
FIG. 6 is a detailed cross-sectional view of the MEMS device of FIG. 1 including a substrate having a bottom port arrangement and a MEMS transducer with a gas sensor disposed thereon in accordance with various implementations.

As shown in FIGS. 1-10, the microphone transducer 150 is disposed within the housing cavity 102 of the MEMS device 100. In one embodiment, the microphone transducer 150 is a MEMS microphone. According to an exemplary embodiment, the microphone transducer 150 includes one or more motors. Accordingly, the microphone transducer 150 may be configured as a single motor microphone and/or a dual motor microphone. As shown in FIGS. 2-10, the microphone transducer 150 includes at least one of (i) a first motor, shown as first motor 152, and (ii) a second motor, shown as second motor 162, supported by a support structure, shown as transducer housing 158. The transducer housing 158 may be formed of a semiconductor material (e.g., silicon, etc.). As shown in FIGS. 2-10, the transducer housing 158 defines a cavity, shown as sound bore 160. According to an exemplary embodiment, the sound bore 160 is configured to direct acoustic energy from a port of the MEMS device 100 to the first motor 152 and/or the second motor 162. As shown in FIGS. 2-10, the first motor 152 includes a first flexible substrate, shown as first diaphragm 154, and a first plate, shown as first backplate 156. As shown in FIG. 6, the second motor 162 includes a second flexible substrate, shown as second diaphragm 164, and a second plate, shown as second backplate 166. In some embodiments, the first motor 152 and/or the second motor 162 include more than one backplate. In some embodiments, the first motor 152 and/or the second motor 162 can include more than one diaphragm. By way of example, the first motor 152 and/or the second motor 162 may include dual backplates such that the first diaphragm 154 and/or the second diaphragm 164 are disposed between a pair of backplates, respectively.

In some embodiments, the first diaphragm 154 and/or the second diaphragm 164 are "free plate" diaphragms (e.g., not secured to the transducer housing 158, etc.). In such embodiments, the first diaphragm 154 and/or the second diaphragm 164 may be free to move within the sound bore 160. In other embodiments, movement of the first diaphragm 154 and/or the second diaphragm 164 is constrained by one or more constraining elements provided around the periphery of the first diaphragm 154 and/or the second diaphragm 164, respectively. In yet other embodiments, the first diaphragm 154 and/or the second diaphragm 164 are anchored at the periphery or certain regions of the periphery to the transducer housing 158 such that central portions thereof may move (e.g., bend, flex, oscillate, etc.) in response to pressure exerted by acoustic waves (i.e., sound). According to an exemplary embodiment, the first backplate 156 and/or the second backplate 166 are rigid and supported by the transducer housing 158. The first diaphragm 154 and the first backplate 156 and/or the second diaphragm 164 and the second backplate 166 include conductive material and collectively form a capacitor, according to an exemplary embodiment. The capacitance of the first motor 152 and/or the second motor 162 may vary as a distance between (i) the first diaphragm 154 and the first backplate 156 and/or (ii) the second diaphragm 164 and the second backplate 166 changes due to the movement of the first diaphragm 154 and/or the second diaphragm 164, respectively, caused by acoustic waves. The first motor 152 and/or the second motor 162 may be configured to generate a first electrical signal (e.g., a voltage signal, a current signal, etc.) based on the acoustic energy. The microphone transducer 150 may include electrical connections for connecting the microphone transducer 150 to a source and/or a ground and the integrated circuit 200 for transmitting the first electrical signal.

In operation, acoustic waves enter the sound bore 160 formed by the transducer housing 158 through the port of the housing (e.g., within the base 110, the lid 130, etc.). The acoustic waves cause the first diaphragm 154 and/or the second diaphragm 164 to flex (e.g., oscillate, etc.), thereby producing the first electrical signal which reflects the capacitance change between (i) the first diaphragm 154 and the first backplate 156 and/or (ii) the second diaphragm 164 and the second backplate 166. In some embodiments, the first diaphragm 154 and/or the second diaphragm 164 include through holes configured to enable equalization of the static pressure on both sides of the first diaphragm 154 and/or the second diaphragm 164, respectively. In other embodiments, the first diaphragm 154 and/or the second diaphragm 164 do not include through holes. In some embodiments, the first backplate 156 and/or the second backplate 166 define a plurality of perforations configured to enable ventilation or free circulation of air between (i) the first diaphragm 154 and the first backplate 156 and/or (ii) the second diaphragm 164 and the second backplate 166, respectively. In some embodiments, there is empty space between the first diaphragm 154 and the transducer housing 158, the second diaphragm 164 and the transducer housing 158, and/or in the transducer housing 158 for air to circulate between the sound bore 160 and the housing cavity 102.

As shown in FIGS. 1-10, the gas sensor 170 is disposed within the housing cavity 102 of the MEMS device 100. According to an exemplary embodiment, the gas sensor 170 is a MEMS gas sensor. In one embodiment, the gas sensor 170 is a metal oxide (MOx) gas sensor. As shown in FIGS. 2-10, the gas sensor 170 includes a third diaphragm, shown as sensor diaphragm 172, and a sensing element, shown as MOx hotplate 174, supported by a support structure, shown as sensor housing 176. The sensor housing 176 defines a cavity, shown as gas bore 178. According to an exemplary embodiment, the gas bore 178 is configured to direct gas from a port of the MEMS device 100 to the sensor diaphragm 172 and/or the MOx hotplate 174. In some embodiments, the sensor diaphragm 172 defines a plurality of apertures configured to provide a passageway for gas to flow into the gas bore 178 and through the sensor diaphragm 172 to interact with the MOx hotplate 174.

According to an exemplary embodiment, the MOx hotplate 174 includes a MOx coating configured to react with specific gases (e.g., causing a resistance change, etc.) to facilitate providing an indication of indoor and/or outdoor air quality. For example, the gas sensor 170 may be configured to facilitate detecting an offensive odor, smoke, a volatile organic compound (VOC) (e.g., carbon-based gases such as acetone, benzene, ethylene glycol, formaldehyde, methylene chloride, perchloroethylene, toluene, xylene, 1,3-butadiene, etc.), carbon monoxide (CO), carbon dioxide ($CO_2$), a nitrogen oxide (NOx), methane, ozone, and/or any other gaseous substances having undesirable characteristics (e.g., gaseous substances that may have a negative impact on human health, comfort, productivity, etc.). The composition of the MOx coating may be selected to provide a desired sensitivity to various gaseous substances. The MOx coating may be printed (e.g., ink-jet printed, etc.) onto the gas sensor 170. According to an exemplary embodiment, the gas sensor 170 is complementary metal-oxide-semiconductor (CMOS) compatible.

The gas sensor 170 may be configured to generate a second electrical signal (e.g., a voltage signal, a current signal, etc.) based on an interaction with a gaseous substance. The gas sensor 170 may include electrical connections for connecting the gas sensor 170 to the integrated circuit 200 for transmitting the second electrical signal. In other embodiments, the gas sensor 170 includes an independent integrated circuit for driving the gas sensor 170 and/or processing the second electrical signal produced by the gas sensor 170. The integrated circuit of the gas sensor 170 may perform operations such as amplification, filtering, processing, etc. to the second electrical signal produced by the gas sensor 170 and generate an output that may be used by an end-user device. The processing operations of the integrated circuit may include analog and/or digital signal processing functions. The output of the integrated circuit may be transmitted through solder to conductive pads on the interior surface 114 of the base 110, then through the conductive vias extending through the base 110 and the connections areas on the exterior surface 112 of the base 110, to the external device.

In some embodiments, the gas sensor 170 and/or the MEMS device 100 additionally or alternatively include at least one of a relative humidity sensor and a temperature sensor. According to an exemplary embodiment, the humidity and/or temperature of the air/gas flowing into the housing cavity 102 may be used by the integrated circuit of the gas sensor 170 and/or the integrated circuit 200 to make a more accurate determination of the composition of the gas within and/or around the MEMS device 100.

As shown in FIGS. 1-10, the integrated circuit 200 is disposed within the housing cavity 102 of the MEMS device 100. As shown in FIGS. 2-10, the integrated circuit 200 is coupled (e.g., attached, etc.) to the interior surface 114 of the base 110. The integrated circuit 200 may be attached to the interior surface 114 of the base 110 with adhesive, solder, etc. According to an exemplary embodiment, the integrated circuit 200 is an application specification integrated circuit (ASIC). The integrated circuit 200 may configured to carry out operations such as amplification, filtering, processing, etc. of the first electrical signals generated by the microphone transducer 150 and/or the second electrical signals generated by the gas sensor 170. The integrated circuit 200 may be further configured to generate an output that may be used by an end-user device (e.g., smartphone, smartwatch, tablet, laptop, hearing aid, etc.). By way of example, the integrated circuit 200 may receive the first electrical signal from the microphone transducer 150, perform some type of processing (e.g., filtering, amplification, etc.), and then transmit the processed first electrical signal to a speaker device to produce a sound output. By way of another example, the integrated circuit 200 may be configured to receive the second electrical signal from the gas sensor 170, determine a composition of the gas based on the second electrical signal, and provide a signal to an end-user device to generate a notification (e.g., an audible indication such as a sound, tone, etc.; a visual indication such as a message, notification, flashing light, etc.; a tactile notification such as a vibration, etc.; etc.) in response to detecting the gas includes an offensive odor, smoke, a VOC, CO, CO2, NOx, methane, ozone, and/or any other gaseous substances having undesirable characteristics and/or effects on humans.

The processing operations performed by the integrated circuit 200 may include analog and/or digital signal processing functions. In some embodiments, the electrical signals produced by the microphone transducer 150 and/or the gas sensor 170 are transmitted to the integrated circuit 200 through wire bonding between connectors (e.g., bond pads, etc.) on the microphone transducer 150 and/or on the gas sensor 170 and corresponding connectors on the integrated circuit 200. The output of the integrated circuit 200 may be transmitted through wire bonding between the integrated circuit 200 and conductive pads on the interior surface 114 of the base 110, then through the conductive vias extending through the base 110 and the connections areas on the exterior surface 112 of the base 110 to the external device. It shall be understood that this is for illustration and should not be limiting; various approaches may be used to make electrical connections between the integrated circuit 200 and the external device for outputting the processed signals.

Bottom Port Arrangements

As shown in FIGS. 2-7, the base 110 defines at least one of a first port, shown as first inlet port 116, and a second port, shown as second inlet port 118, such that the MEMS device 100 is configured as a bottom port MEMS device. The first inlet port 116 and/or the second inlet port 118 may be configured to provide a passageway for acoustic waves (e.g., sound, etc.) and/or air flow to enter the housing cavity 102. The first inlet port 116 and/or the second inlet port 118 may have any shape (e.g., circle, oval, rectangle, etc.) and/or profile (e.g., linear, sloped, non-linear, funnel/cone shaped, etc.). In some embodiments, the MEMS device 100 includes a mesh material disposed along the exterior surface 112 of the base 110 over the first inlet port 116 and/or the second inlet port 118 (e.g., to prevent debris from entering the housing cavity 102, etc.). In some embodiments, the base 110 defines a plurality of first inlet ports 116 and/or a plurality of second inlet ports 118 (e.g., two, three, etc.).

Figure 1:
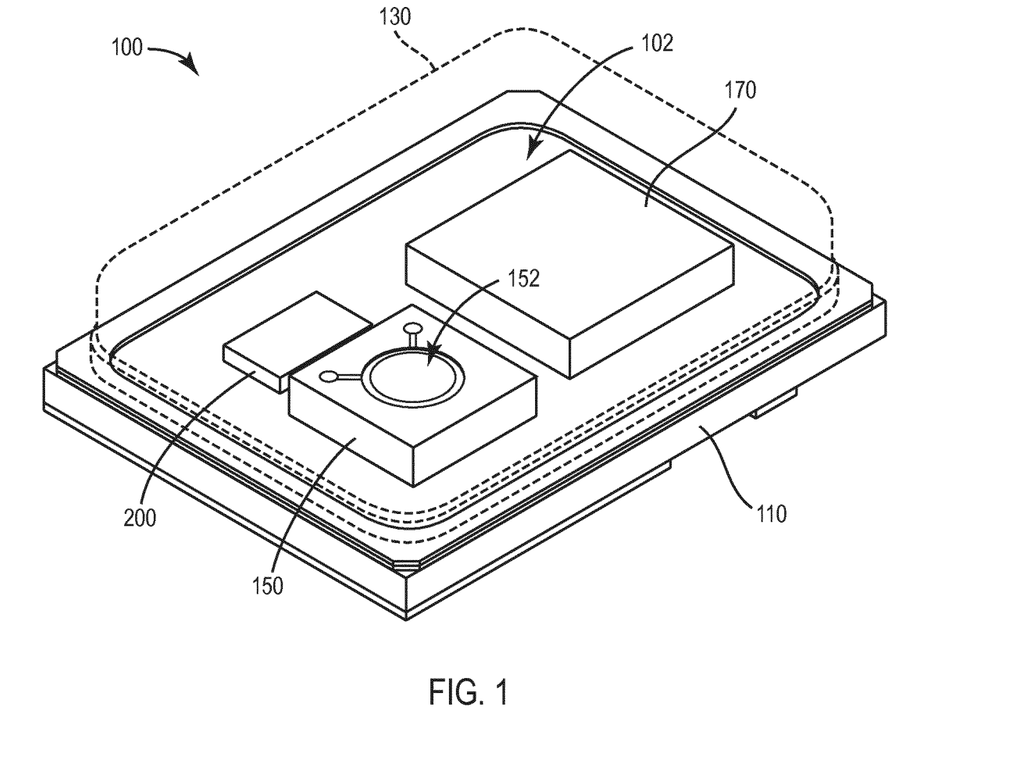
FIG. 1 is a perspective view of a MEMS device in accordance with various implementations.
Figure 2:
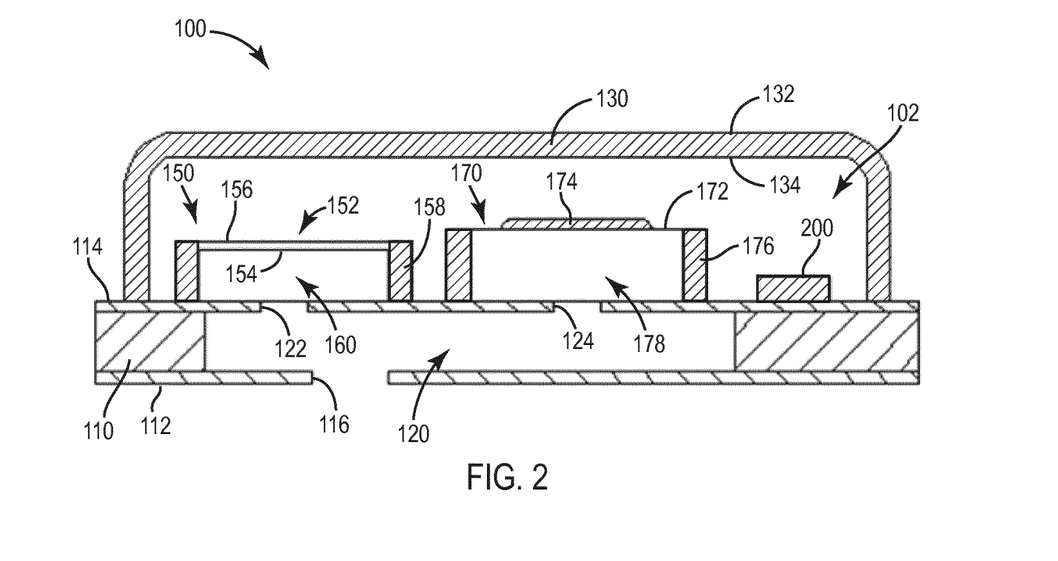
FIGS. 2-5 are various detailed cross-sectional views of the MEMS device of FIG. 1 including a substrate having a bottom port arrangement and a spacer having a MEMS transducer and a gas sensor disposed thereon in accordance with various implementations.
Figure 3:
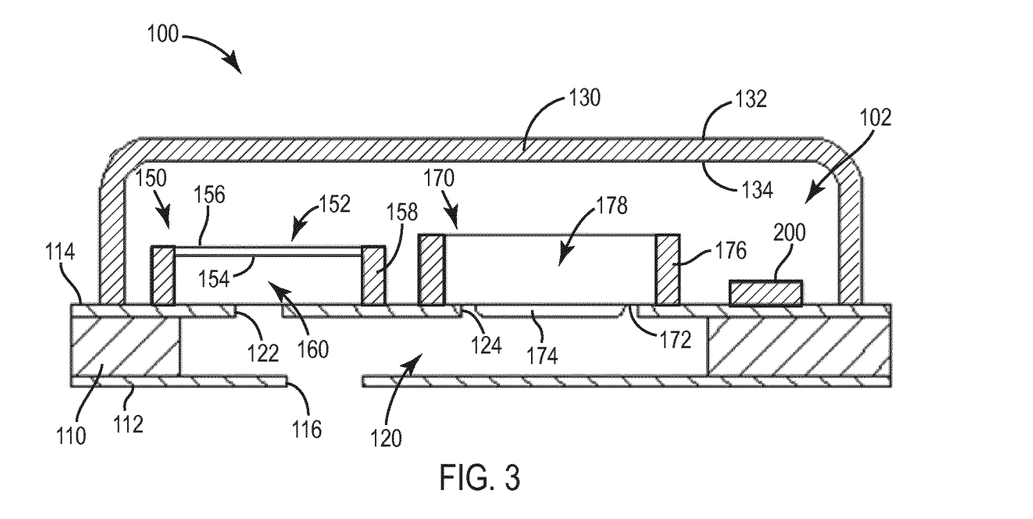

As shown in FIGS. 2 and 3, the exterior surface 112 and the interior surface 114 of the base 110 are spaced relative to one another such that an air gap is formed therebetween. The air gap defines a cavity, shown as base cavity 120, between the exterior surface 112 and the interior surface 114 of the base 110 (e.g., the base 110 defines a spacer, etc.). As shown in FIGS. 2 and 3, the exterior surface 112 of the base 110 defines the first inlet port 116 and the interior surface 114 defines a first aperture, shown as transducer aperture 122, and a second aperture, shown as sensor aperture 124. According to an exemplary embodiment, the base cavity 120, the transducer aperture 122, and the sensor aperture 124 fluidly couple the first inlet port 116 to the housing cavity 102 of the housing. By way of example, the base cavity 120 may receive and direct acoustic waves and/or gas that enter the MEMS device 100 through the first inlet port 116 to the transducer aperture 122 and/or the sensor aperture 124.

As shown in FIGS. 2 and 3, the transducer housing 158 of the microphone transducer 150 is coupled to the interior surface 114 of the base 110 (e.g., secured, attached, fastened, with adhesive, with solder, etc.). The microphone transducer 150 is disposed over the transducer aperture 122 such that the sound bore 160 and the first motor 152 of the microphone transducer 150 are positioned to receive acoustic waves that enter the MEMS device 100 through the first inlet port 116 of the base 110.

As shown in FIGS. 2 and 3, the sensor housing 176 of the gas sensor 170 is coupled to the interior surface 114 of the base 110 (e.g., secured, attached, fastened, with adhesive, with solder, etc.). As shown in FIG. 2, the gas sensor 170 is disposed over the sensor aperture 124 in a first orientation (e.g., the MOx hotplate 174 is positioned within the housing cavity 102 opposite the interior surface 114, etc.) such that the gas bore 178 and the sensor diaphragm 172 of the gas sensor 170 are positioned to receive gas that enters the MEMS device 100 through the first inlet port 116 and the sensor aperture 124 of the base 110. In the first orientation, the sensor diaphragm 172 of the gas sensor 170 may include a plurality of apertures positioned to provide a passageway for the gas to flow from the gas bore 178, through the sensor diaphragm 172, and into the housing cavity 102 to interact with the MOx hotplate 174. As shown in FIG. 3, the gas sensor 170 is disposed over the sensor aperture 124 in a second orientation (e.g., a flip-chip orientation, etc.) such that the MOx hotplate 174 extends at least partially through the sensor aperture 124 and is positioned to receive and interact with the gas that enters the MEMS device 100 through the first inlet port 116 of the base 110.

As shown in FIGS. 4 and 5, the MEMS device 100 includes a spacer, shown as spacer 190. The spacer 190 includes a body, shown as spacer housing 192, that defines a cavity, shown as spacer cavity 194, a first aperture, shown as transducer aperture 196, and a second aperture, shown as sensor aperture 198. In one embodiment, the spacer 190 is manufacture from silicon. In other embodiments, the spacer 190 is manufactured from a different material (e.g., SU-8, etc.). According to an exemplary embodiment, the spacer cavity 194, the transducer aperture 196, and the sensor aperture 198 fluidly couple the first inlet port 116 to the housing cavity 102 of the housing. As shown in FIGS. 4 and 5, the spacer housing 192 of the spacer 190 is coupled to the interior surface 114 of the base 110 (e.g., secured, attached, fastened, with adhesive, with solder, etc.). The spacer 190 is disposed over the first inlet port 116 such that the spacer cavity 194 receives and directs acoustic waves and/or gas that enter the MEMS device 100 through the first inlet port 116 to the transducer aperture 196 and/or the sensor aperture 198.

As shown in FIGS. 4 and 5, the transducer housing 158 of the microphone transducer 150 is coupled to the spacer housing 192 of the spacer 190 (e.g., secured, attached, fastened, with adhesive, with solder, etc.). The microphone transducer 150 is disposed over the transducer aperture 196 such that the sound bore 160 and the first motor 152 of the microphone transducer 150 are positioned to receive acoustic waves that enter the MEMS device 100 through the first inlet port 116 of the base 110.

As shown in FIGS. 4 and 5, the sensor housing 176 of the gas sensor 170 is coupled to the spacer housing 192 of the spacer 190 (e.g., secured, attached, fastened, with adhesive, with solder, etc.). As shown in FIG. 4, the gas sensor 170 is disposed over the sensor aperture 198 in the first orientation such that the gas bore 178 and the sensor diaphragm 172 of the gas sensor 170 are positioned to receive gas that enters the MEMS device 100 through the first inlet port 116 and the sensor aperture 198. In the first orientation, the sensor diaphragm 172 of the gas sensor 170 may include a plurality of apertures positioned to provide a passageway for the gas to flow from the gas bore 178, through the sensor diaphragm 172, and into the housing cavity 102 to interact with the MOx hotplate 174. As shown in FIG. 5, the gas sensor 170 is disposed over the sensor aperture 198 in the second orientation such that the MOx hotplate 174 extends at least partially through the sensor aperture 198 and is positioned to receive and interact with the gas that enters the MEMS device 100 through the first inlet port 116 of the base 110.

As shown in FIG. 6, the microphone transducer 150 includes the first motor 152 and the second motor 162, and the transducer housing 158 of the microphone transducer 150 is coupled to the interior surface 114 of the base 110 (e.g., secured, attached, fastened, with adhesive, with solder, etc.). The microphone transducer 150 is disposed over the transducer aperture 122 such that the sound bore 160, the first motor 152, and the second motor 162 of the microphone transducer 150 are positioned to receive acoustic waves and/or gas that enter the MEMS device 100 through the first inlet port 116 of the base 110. According to an exemplary embodiment, the sound bore 160, the first motor 152, and the second motor 162 fluidly couple the first inlet port 116 to the housing cavity 102 of the housing. The microphone transducer 150 is disposed over the first inlet port 116 such that the sound bore 160 receives and directs acoustic waves and/or gas that enter the MEMS device 100 through the first inlet port 116 to the first motor 152 and/or the second motor 162.

As shown in FIG. 6, the sensor housing 176 of the gas sensor 170 is coupled to the transducer housing 158 of the microphone transducer 150 (e.g., secured, attached, fastened, with adhesive, with solder, etc.). According to the exemplary embodiment shown in FIG. 6, the gas sensor 170 is disposed over the second motor 162 in the second orientation such that the MOx hotplate 174 extends at least partially through the second motor 162 and is positioned to receive and interact with the gas that enters the MEMS device 100 through the first inlet port 116 of the base 110. According another exemplary embodiment, the gas sensor 170 is disposed over the second motor 162 in the first orientation such that the gas bore 178 and the sensor diaphragm 172 of the gas sensor 170 are positioned to receive gas that enters the MEMS device 100 through the first inlet port 116 and the second motor 162. In the first orientation, the sensor diaphragm 172 of the gas sensor 170 may include a plurality of apertures positioned to provide a passageway for the gas to flow from the gas bore 178, through the sensor diaphragm 172, and into the housing cavity 102 to interact with the MOx hotplate 174. In other embodiments, the gas sensor 170 is disposed over the first motor 152. In an alternative embodiment, the microphone transducer 150 does not include the second motor 162, but instead defines a sensor aperture (e.g., similar to the sensor aperture 124 of the base 110, the sensor aperture 198 of the spacer 190, etc.).

Figure 7:
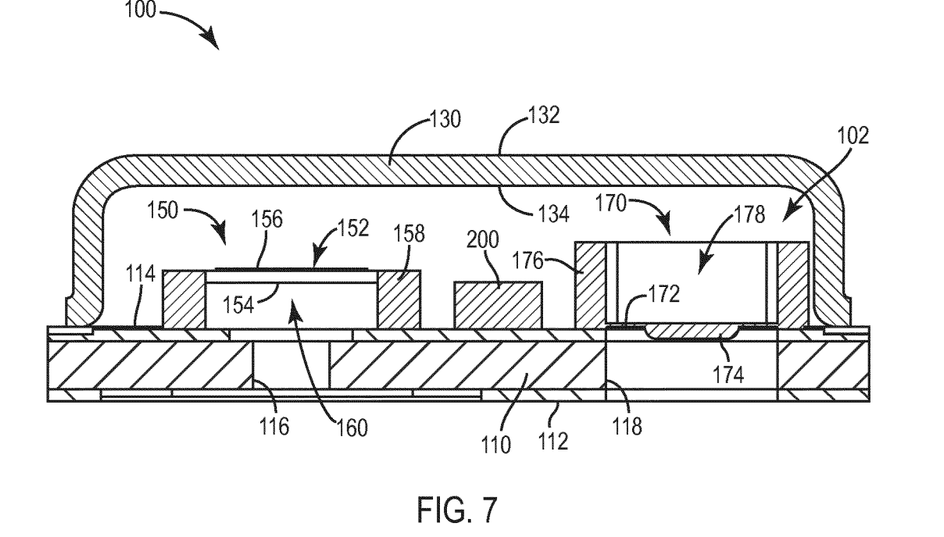
FIG. 7 is a detailed cross-sectional view of the MEMS device of FIG. 1 including a substrate having a dual bottom port arrangement, and a MEMS transducer and a gas sensor disposed on the substrate in accordance with various implementations.

As shown in FIG. 7, the base 110 defines the first inlet port 116 and the second inlet port 118. According to an exemplary embodiment, the first inlet port 116 and the second inlet port 118 fluidly couple the housing cavity 102 of the housing to the ambient environment. As shown in FIG. 7, the transducer housing 158 of the microphone transducer 150 is coupled to the interior surface 114 of the base 110 (e.g., secured, attached, fastened, with adhesive, with solder, etc.). The microphone transducer 150 is disposed over the first inlet port 116 such that the sound bore 160 and the first motor 152 of the microphone transducer 150 are positioned to receive acoustic waves that enter the MEMS device 100 through the first inlet port 116 of the base 110.

As shown in FIG. 7, the sensor housing 176 of the gas sensor 170 is coupled to the interior surface 114 of the base 110 (e.g., secured, attached, fastened, with adhesive, with solder, etc.). According to the exemplary embodiment shown in FIG. 7, the gas sensor 170 is disposed over the second inlet port 118 in the second orientation such that the MOx hotplate 174 extends at least partially within the second inlet port 118 and is positioned to directly receive and interact with the gas that enters the MEMS device 100 through the second inlet port 118 of the base 110. According another exemplary embodiment, the gas sensor 170 is disposed over the second inlet port 118 in the first orientation such that the gas bore 178 and the sensor diaphragm 172 of the gas sensor 170 are positioned to receive gas that enters the MEMS device 100 through the second inlet port 118 of the base 110. In the first orientation, the sensor diaphragm 172 of the gas sensor 170 may include a plurality of apertures positioned to provide a passageway for the gas to flow from the gas bore 178, through the sensor diaphragm 172, and into the housing cavity 102 to interact with the MOx hotplate 174.

Top Port Arrangements

Figure 8:
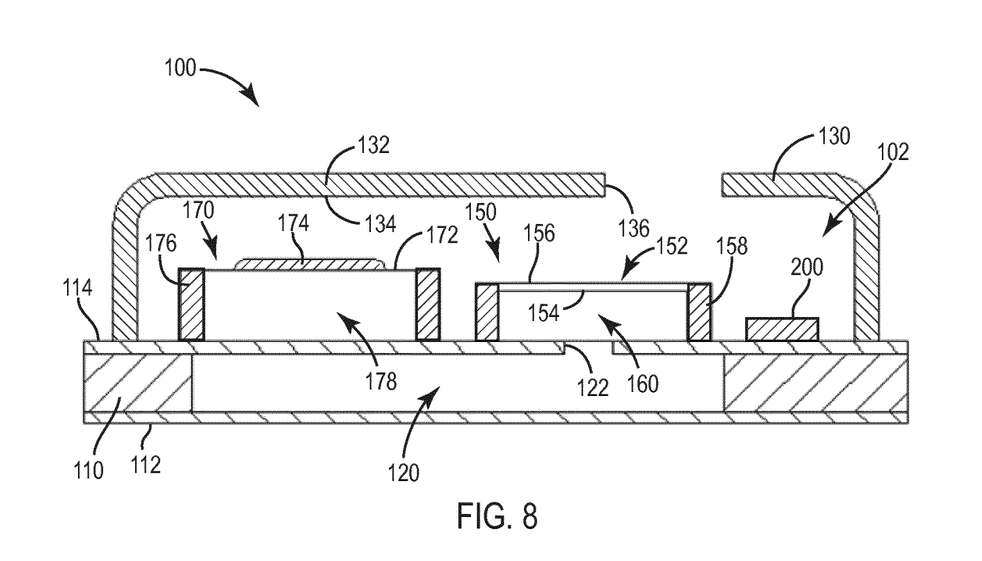
FIG. 8 is a detailed cross-sectional view of the MEMS device of FIG. 1 including a lid having a top port arrangement, and a MEMS transducer and a gas sensor disposed on a substrate in accordance with various implementations.
Figure 9:
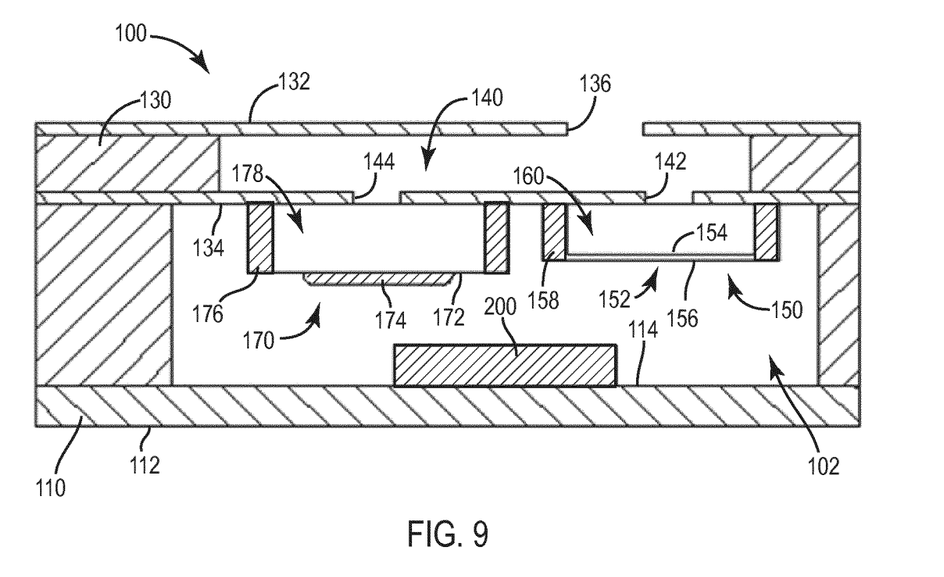
FIG. 9 is a detailed cross-sectional views of the MEMS device of FIG. 1 including a lid having a top port arrangement and defining a spacer having a MEMS transducer and a gas sensor disposed thereon in accordance with various implementations.
Figure 10:
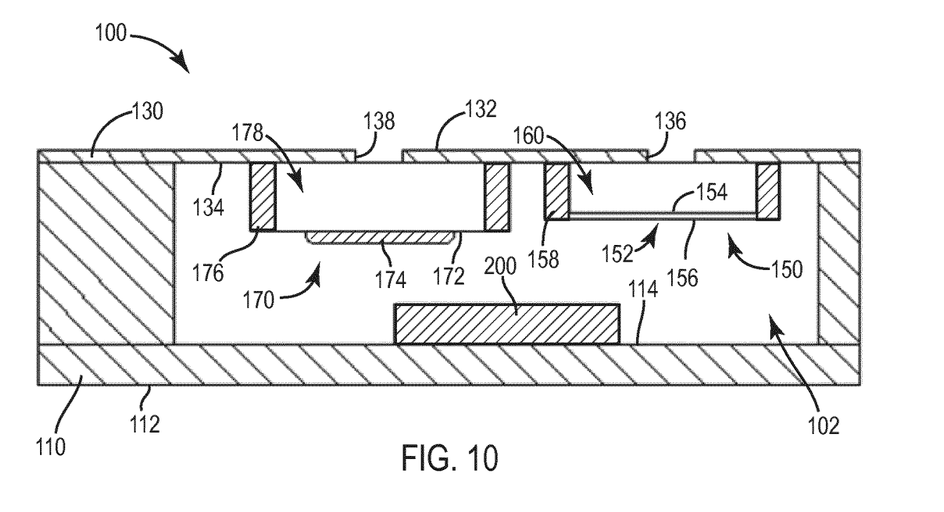
FIG. 10 is a detailed cross-sectional view of the MEMS device of FIG. 1 including a lid having a dual top port arrangement, and a MEMS transducer and a gas sensor disposed on the lid in accordance with various implementations.

As shown in FIGS. 8-10, the lid 130 defines at least one of a first port, shown as first inlet port 136, and a second port, shown as second inlet port 138, such that the MEMS device 100 is configured as a top port MEMS device. The first inlet port 136 and/or the second inlet port 138 may be configured to provide a passageway for acoustic waves (e.g., sound, etc.) and/or air flow to enter the housing cavity 102. The first inlet port 136 and/or the second inlet port 138 may have any shape (e.g., circle, oval, rectangle, etc.) and/or profile (e.g., linear, sloped, non-linear, funnel/cone shaped, etc.). As shown in FIGS. 2-10, the lid 130 includes a first surface, shown as exterior surface 132, and an opposing second surface, shown as interior surface 134. In some embodiments, the MEMS device 100 includes a mesh material disposed along the exterior surface 132 of the lid 130 over the first inlet port 136 and/or the second inlet port 138 (e.g., to prevent debris from entering the housing cavity 102, etc.). In some embodiments, the lid 130 defines a plurality of first inlet ports 136 and/or a plurality of second inlet ports 138 (e.g., two, three, etc.).

As shown in FIG. 8, the interior surface 114 of the base 110 defines the transducer aperture 122 and the base 110 defines the base cavity 120 between the exterior surface 112 and the interior surface 114. The transducer housing 158 of the microphone transducer 150 is coupled to the interior surface 114 of the base 110 (e.g., secured, attached, fastened, with adhesive, with solder, etc.). The microphone transducer 150 is disposed over the transducer aperture 122. The first motor 152 may thereby be positioned to receive acoustic waves that enter the MEMS device 100 through the first inlet port 136 of the lid 130. According to an exemplary embodiment, the transducer aperture 122 is positioned to fluidly couple the base cavity 120 of the base 110 to the housing cavity 102 of the housing such that the acoustic waves may interact with the first motor 152 and then flow through the sound bore 160 into the base cavity 120 through the transducer aperture 122. Such an arrangement may facilitate improving the signal-to-noise ratio (SNR) of the MEMS device 100.

As shown in FIG. 8, the sensor housing 176 of the gas sensor 170 is coupled to the interior surface 114 of the base 110 (e.g., secured, attached, fastened, with adhesive, with solder, etc.) in the first orientation such that the MOx hotplate 174 is disposed within the housing cavity 102 and positioned to directly receive and interact with the gas that enters the MEMS device 100 through the first inlet port 136 of the lid 130.

As shown in FIG. 9, the exterior surface 132 and the interior surface 134 of the lid 130 are spaced relative to one another such that an air gap is formed therebetween. The air gap defines a cavity, shown as lid cavity 140, between the exterior surface 132 and the interior surface 134 of the lid 130 (e.g., the lid 130 defines a spacer, etc.). As shown in FIG. 9, the exterior surface 132 of the lid 130 defines the first inlet port 136 and the interior surface 134 defines a first aperture, shown as transducer aperture 142, and a second aperture, shown as sensor aperture 144. According to an exemplary embodiment, the lid cavity 140, the transducer aperture 142, and the sensor aperture 144 fluidly couple the first inlet port 136 to the housing cavity 102 of the housing. By way of example, the lid cavity 140 may receive and direct acoustic waves and/or gas that enter the MEMS device 100 through the first inlet port 136 to the transducer aperture 142 and/or the sensor aperture 144.

As shown in FIG. 9, the transducer housing 158 of the microphone transducer 150 is coupled to the interior surface 134 of the lid 130 (e.g., secured, attached, fastened, with adhesive, with solder, etc.). The microphone transducer 150 is disposed over the transducer aperture 142 such that the sound bore 160 and the first motor 152 of the microphone transducer 150 are positioned to receive acoustic waves that enter the MEMS device 100 through the first inlet port 136 of the lid 130.

As shown in FIG. 9, the sensor housing 176 of the gas sensor 170 is coupled to the interior surface 134 of the lid 130 (e.g., secured, attached, fastened, with adhesive, with solder, etc.). According to the exemplary embodiment shown in FIG. 9, the gas sensor 170 is disposed over the sensor aperture 144 in a first orientation (e.g., the MOx hotplate 174 is positioned within the housing cavity 102 opposite the interior surface 134, etc.) such that the gas bore 178 and the sensor diaphragm 172 of the gas sensor 170 are positioned to receive gas that enters the MEMS device 100 through the first inlet port 136 and the sensor aperture 144 of the lid 130. In the first orientation, the sensor diaphragm 172 of the gas sensor 170 may include a plurality of apertures positioned to provide a passageway for the gas to flow from the gas bore 178, through the sensor diaphragm 172, and into the housing cavity 102 to interact with the MOx hotplate 174. According to another embodiment, the gas sensor 170 is disposed over the sensor aperture 144 in a second orientation (e.g., a flip-chip orientation, etc.) such that the MOx hotplate 174 extends at least partially through the sensor aperture 144 and is positioned to receive and interact with the gas that enters the MEMS device 100 through the first inlet port 136 of the lid 130.

As shown in FIG. 10, the lid 130 defines the first inlet port 136 and the second inlet port 138. According to an exemplary embodiment, the first inlet port 136 and the second inlet port 138 fluidly couple the housing cavity 102 of the housing to the ambient environment. As shown in FIG. 10, the transducer housing 158 of the microphone transducer 150 is coupled to the interior surface 134 of the lid 130 (e.g., secured, attached, fastened, with adhesive, with solder, etc.). The microphone transducer 150 is disposed over the first inlet port 136 such that the sound bore 160 and the first motor 152 of the microphone transducer 150 are positioned to receive acoustic waves that enter the MEMS device 100 through the first inlet port 136 of the lid 130.

As shown in FIG. 10, the sensor housing 176 of the gas sensor 170 is coupled to the interior surface 134 of the lid 130 (e.g., secured, attached, fastened, with adhesive, with solder, etc.). According to the exemplary embodiment shown in FIG. 10, the gas sensor 170 is disposed over the second inlet port 138 in the first orientation such that the gas bore 178 and the sensor diaphragm 172 of the gas sensor 170 are positioned to receive gas that enters the MEMS device 100 through the second inlet port 138 of the lid 130. In the first orientation, the sensor diaphragm 172 of the gas sensor 170 may include a plurality of apertures positioned to provide a passageway for the gas to flow from the gas bore 178, through the sensor diaphragm 172, and into the housing cavity 102 to interact with the MOx hotplate 174. According another exemplary embodiment, the gas sensor 170 is disposed over the second inlet port 138 in the second orientation such that the MOx hotplate 174 extends at least partially within the second inlet port 138 and is positioned to directly receive and interact with the gas that enters the MEMS device 100 through the second inlet port 138 of the lid 130.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

The invention claimed is:

1. A microelectromechanical system (MEMS) device comprising:
    a housing including a substrate and a cover, the substrate and the cover cooperatively forming an internal cavity, the substrate comprising:
        an exterior surface defining a port, wherein the port fluidly couples the internal cavity to an external environment; and
        an interior surface defining a first aperture and a second aperture, the interior surface spaced apart from the exterior surface to form a cavity therebetween different from the internal cavity, wherein the first aperture, the second aperture, and the cavity fluidly couple the port to the internal cavity;
    a transducer disposed within the internal cavity and positioned over the first aperture to receive acoustic energy through the port and the first aperture, the transducer configured to convert the acoustic energy into an electrical signal; and
    a sensor disposed within the internal cavity and positioned over the second aperture to receive a gas through the port and the second aperture.

2. The MEMS device of claim 1, wherein the transducer is coupled to the interior surface of the substrate and disposed over the first aperture, and wherein the sensor is coupled to the interior surface of the substrate and disposed over the second aperture.

3. The MEMS device of claim 1, further comprising a spacer disposed within the internal cavity and disposed along the substrate surrounding the port, the spacer defining a cavity, a first aperture, and a second aperture, wherein the cavity, the first aperture, and the second aperture fluidly couple the port to the internal cavity of the housing.

4. The MEMS device of claim 3, wherein the transducer is coupled to the spacer and disposed over the first aperture, and wherein the sensor is coupled to the spacer and disposed over the second aperture.

5. The MEMS device of claim 2, wherein the transducer includes a transducer housing defining a cavity, a first motor having a diaphragm, and a backplate.

6. The MEMS device of claim 1, wherein the transducer includes a transducer housing defining a cavity and at least one of (i) a first motor having a first diaphragm and a first backplate or (ii) a second motor having a second diaphragm and a second backplate, wherein the transducer housing is disposed along the substrate surrounding the port such that the cavity, the first motor, and the second motor of the transducer fluidly couple the port to the internal cavity of the housing, and wherein the sensor is coupled to the transducer housing and disposed over one of the first motor and the second motor.

7. The MEMS device of claim 1, wherein the port includes a first port and a second port, the first port and the second port fluidly coupling the internal cavity of the housing to the external environment, wherein the transducer is coupled to the substrate and disposed over the first port, and wherein the sensor is coupled to the substrate and disposed over with the second port.

8. The MEMS device of claim 1, wherein the transducer includes a MEMS microphone.

9. The MEMS device of claim 1, wherein the sensor includes at least one of a gas sensor, a humidity sensor, or a temperature sensor, and wherein the sensor is configured to facilitate detecting at least one of an offensive odor, smoke, a volatile organic compound, carbon monoxide, carbon dioxide, a nitrogen oxide, methane, ozone, humidity, or temperature.

10. A microelectromechanical system (MEMS) device comprising:
   a housing including a substrate and a lid, the substrate and the lid cooperatively forming an internal cavity, the housing comprising:
      an exterior surface defining a port that fluidly couples the internal cavity to an external environment; and
      an interior surface defining a first aperture and a second aperture, the interior surface spaced apart from the exterior surface to form a cavity therebetween different from the internal cavity, wherein the first aperture, the second aperture and the cavity fluidly couple the port to the internal cavity;
   a transducer disposed within the internal cavity and positioned over the first aperture to receive acoustic energy through the port and the first aperture, the transducer configured to convert the acoustic energy into an electrical signal; and
   a sensor disposed within the internal cavity and positioned over the second aperture to receive a gas through the port and the second aperture, the sensor configured to facilitate detecting at least one of an offensive odor, smoke, a volatile organic compound, carbon monoxide, carbon dioxide, a nitrogen oxide, methane, or ozone.

11. The MEMS device of claim 10, wherein the transducer and the sensor are coupled to the substrate.

12. The MEMS device of claim 10, wherein the substrate includes the exterior surface and the interior surface spaced from the exterior surface thereby forming a cavity therebetween.

13. The MEMS device of claim 10, wherein the lid includes the exterior surface and the interior surface spaced from the exterior surface thereby forming a cavity therebetween.

14. The MEMS device of claim 13, wherein the transducer is coupled to the interior surface of the lid and disposed over the first aperture, and wherein the sensor is coupled to the interior surface of the lid and disposed over the second aperture.

15. The MEMS device of claim 10, wherein the port includes a first port and a second port, the first port and the second port fluidly coupling the internal cavity of the housing to the external environment, wherein the transducer is disposed over the first port, and wherein the sensor is disposed over with the second port.

16. The MEMS device of claim 10, wherein the transducer includes a MEMS microphone.

17. The MEMS device of claim 10, wherein the sensor includes at least one of a gas sensor, a humidity sensor, or a temperature sensor.

18. A microphone device comprising:
   a substrate;
   a lid coupled to the substrate, the substrate and the lid cooperatively forming an internal cavity, wherein at least one of the substrate or the lid comprises:
      an exterior surface defining a port fluidly coupling the internal cavity to an external environment; and
      an interior surface defining a first aperture and a second aperture, the interior surface spaced apart from the exterior surface thereby forming a cavity therebetween different than the internal cavity, wherein the first aperture, the second aperture, and the cavity fluidly connect the port to the internal cavity;
   a microphone transducer disposed within the internal cavity and positioned over the first aperture to receive acoustic energy through the port and the first aperture, the microphone transducer configured to generate a first electrical signal based on the acoustic energy; and
   a gas sensor disposed within the internal cavity and positioned over the second aperture to receive a gas through the port and the second aperture, the gas sensor configured to interact with the gas and generate a second electrical signal based on the gas.

19. The microphone device of claim 18, further comprising an integrated circuit coupled to the microphone transducer and the gas sensor, the integrated circuit configured to:
   receive the first electrical signal from the microphone transducer;
   transmit the first electrical signal to a speaker device;
   receive the second electrical signal from the gas sensor;
   determine a composition of the gas based on the second electrical signal; and
   provide a signal to a device to generate a notification in response to detecting the gas includes at least one of an offensive odor, smoke, a volatile organic compound, carbon monoxide, carbon dioxide, a nitrogen oxide, methane, or ozone.

* * * * *